United States Patent
Villion et al.

(10) Patent No.: US 8,929,444 B2
(45) Date of Patent: Jan. 6, 2015

(54) DATA COMMUNICATION UNIT, DATA COMMUNICATION NETWORK AND METHOD OF DECODING

(75) Inventors: Mathieu Villion, Toulouse (FR); Laurence Poirier-Claraac, Toulouse (FR)

(73) Assignee: Freescale Semiconductor, Inc., Austin, TX (US)

( * ) Notice: Subject to any disclaimer, the term of this patent is extended or adjusted under 35 U.S.C. 154(b) by 849 days.

(21) Appl. No.: 12/527,733

(22) PCT Filed: Feb. 19, 2007

(86) PCT No.: PCT/IB2007/051452
§ 371 (c)(1),
(2), (4) Date: Aug. 19, 2009

(87) PCT Pub. No.: WO2008/102215
PCT Pub. Date: Aug. 28, 2008

(65) Prior Publication Data
US 2010/0111168 A1   May 6, 2010

(51) Int. Cl.
| H04N 7/12 | (2006.01) |
| H04L 1/00 | (2006.01) |
| H04N 19/65 | (2014.01) |
| H04N 21/643 | (2011.01) |
| H04N 21/438 | (2011.01) |
| H04L 1/20 | (2006.01) |
| H04N 19/89 | (2014.01) |
| H03M 13/29 | (2006.01) |
| H03M 13/15 | (2006.01) |

(52) U.S. Cl.
CPC .............. *H04L 1/0057* (2013.01); *H04L 1/005* (2013.01); *H03M 13/2936* (2013.01); *H04N 19/00854* (2013.01); *H04N 21/64315* (2013.01); *H04L 1/0061* (2013.01); *H03M 13/1515* (2013.01); *H04N 21/4382* (2013.01); *H04L 1/201* (2013.01); *H04N 19/00933* (2013.01); *H04L 1/0082* (2013.01)
USPC .................................. 375/240.12; 375/240.1

(58) Field of Classification Search
None
See application file for complete search history.

(56) References Cited

U.S. PATENT DOCUMENTS 7,019,723 B2 * 3/2006 Tsuji ............................ 345/87
7,447,980 B2 * 11/2008 Xu et al. ...................... 714/776

(Continued)

FOREIGN PATENT DOCUMENTS

| WO | 2004/079982 A1 | 9/2004 |
| WO | 2004/086670 A1 | 10/2004 |

(Continued)

OTHER PUBLICATIONS

PCT/IB2007/051452 International Search Report and Written Opinion mailed Oct. 30, 2007.

(Continued)

*Primary Examiner* — Hassan Phillips
*Assistant Examiner* — Mark A Mais

(57) ABSTRACT

A wireless communication unit comprises a receiver for receiving information from a remote transmitter unit. The receiver comprises a demodulator for demodulating received data packets operably coupled to a decoder arranged to perform a cyclic redundancy check (CRC) on the demodulated received data packets and perform multi-protocol encapsulated (MPE) decoding thereon. The demodulator forwards both valid CRC corrected data packets and non-corrected CRC data packets to the decoder and the decoder is configured to place the MPE non-corrected CRC data packets into Reed Solomon (RS) code words.

20 Claims, 6 Drawing Sheets

(56) References Cited

U.S. PATENT DOCUMENTS

| | | | |
|---|---|---|---|
| 7,530,007 B2* | 5/2009 | Touzni et al. | 714/776 |
| 7,865,218 B2* | 1/2011 | Iguchi et al. | 455/574 |
| 2006/0236210 A1* | 10/2006 | Touzni et al. | 714/776 |
| 2007/0089038 A1* | 4/2007 | Xu et al. | 714/776 |
| 2009/0217138 A1* | 8/2009 | Touzni et al. | 714/776 |

FOREIGN PATENT DOCUMENTS

| | | |
|---|---|---|
| WO | 2005/046247 A1 | 5/2005 |
| WO | 2006003531 A1 | 1/2006 |
| WO | 2006077523 A1 | 7/2006 |

OTHER PUBLICATIONS

Massey, James; "Shift-Register Synthesis and BCH Decoding"; IEEE Transactions on Information Theory; Jan. 1969; pp. 122-127; vol. IT-15, No. 1; IEEE.

Joki, Heidi et al.; "A Novel Algorithm for Decapsulation and Decoding of DVB-H Link Layer Forward Error Correction"; IEEE ICC 2006 Proceedings; 2006; pp. 5283-5288; IEEE.

ETSY, "Digital Video Broadcasting (DVB); Transmission System for Handheld Terminals (DVB-H)," ETSI EN 302 304 v1.1.1; Nov. 2004, 14 pages.

* cited by examiner

FIG. 1 – PRIOR ART
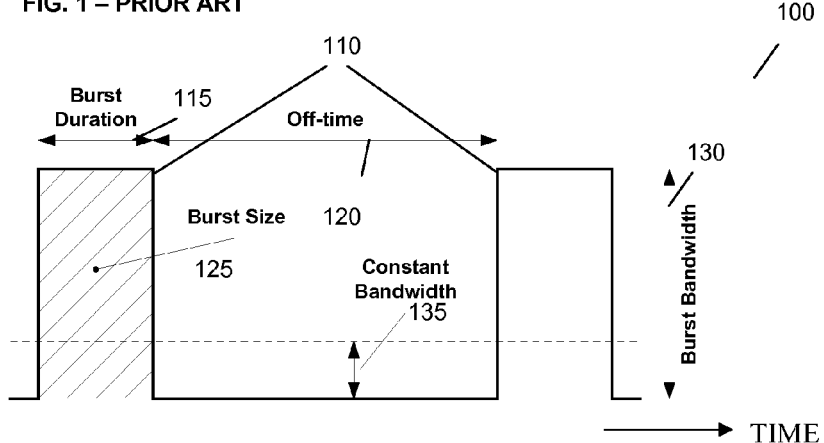
FIG. 2 – PRIOR ART
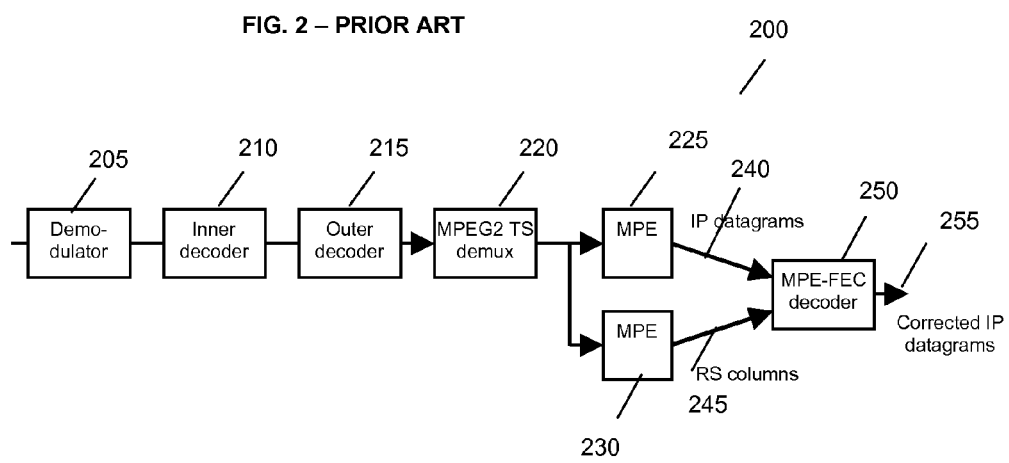

FIG. 3 – PRIOR ART
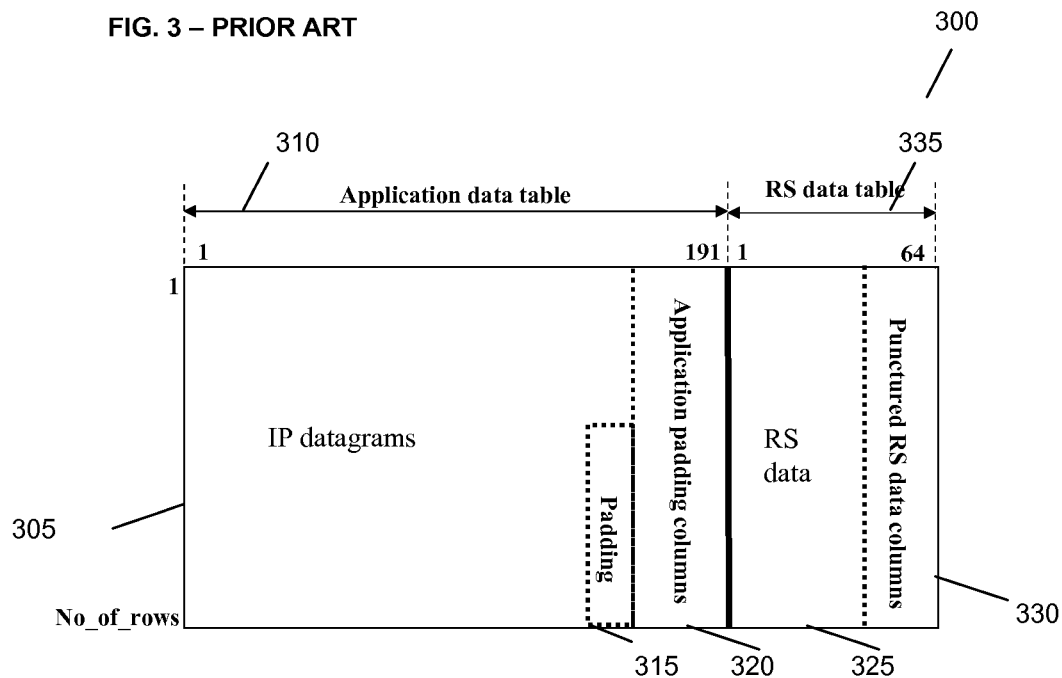
FIG. 4
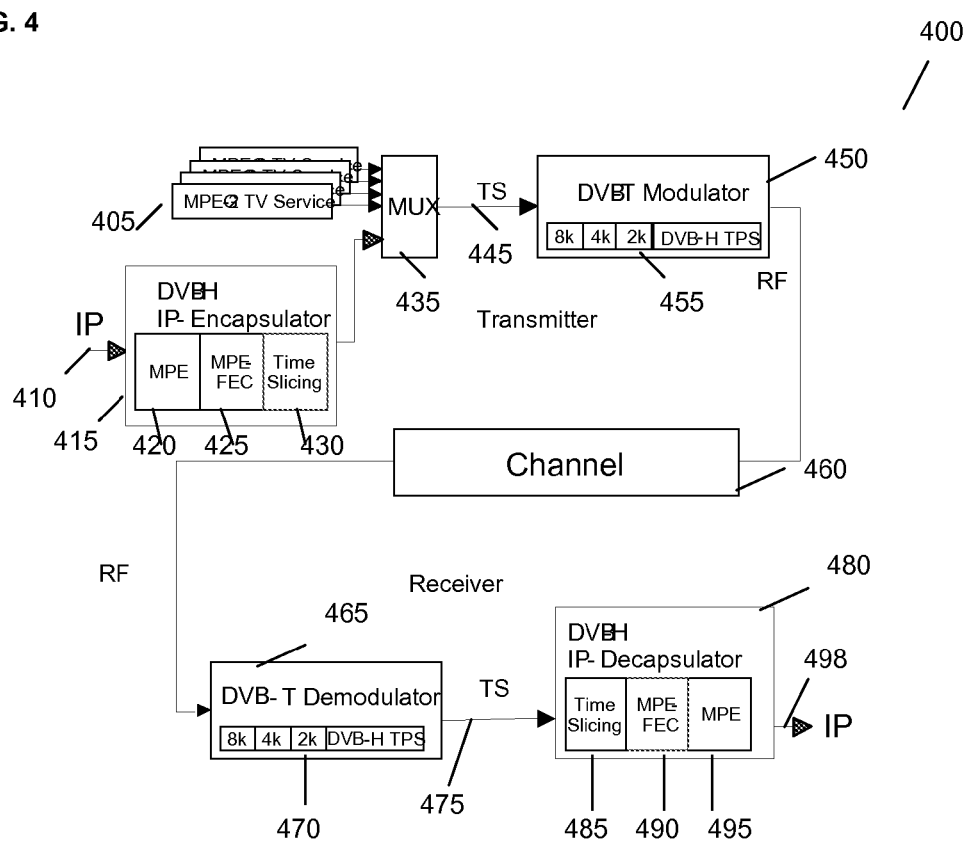

US 8,929,444 B2

DATA COMMUNICATION UNIT, DATA COMMUNICATION NETWORK AND METHOD OF DECODING

FIELD OF THE INVENTION

The invention relates to decoding in data communication units. The invention is applicable to, but not limited to, a data communication unit, data communication network and a method for multi-protocol encapsulation (MPE) decoding suitable for Digital Video Broadcasting.

BACKGROUND OF THE INVENTION

Present day data communication networks, both wireless and wire-line, have a requirement to transfer data between communication units. Data, in this context, includes many forms of communication, such as speech, multimedia, signalling, etc. Typically, such data communication needs to be effectively and efficiently transported, in order to optimise use of limited communication resources.

Due to the recent growth in communications, particularly in Internet and wireless communications, there exists a need to provide improved data transfer techniques, where a particular quality of service of the transmitted data is often required or desired by the end user.

The European Telecommunication Standards Institute (ETSI) has defined a number of communication standards with the aim that a number of manufacturers are able to provide equipment that supports the same technology and are able to inter-operate with other equipment compliant with that standard. One such data communication standard developed by ETSI is the Terrestrial Digital Video Broadcasting (DVB-T) standard (ETSI EN 300 744), which has been developed for digital television sets and set-top boxes.

A recent variation of the DVB-T standard that has been adopted to incorporate enhanced features to allow improved reception of digital video broadcasting services for mobile devices is the digital video broadcasting—handset DVB-H standard. A DVB-H unit is battery powered, and the nature of the broadcast transmission offers a possibility to the DVB-H unit to repeatedly power off components/circuits of the DVB-H unit's receiver chain to increase battery life. It is anticipated that DVB-H units may receive transmissions at a variety of locations, such as: indoor, outdoor, as a pedestrian, within a moving vehicle, etc.

One feature that has been incorporated within the DVB-H standard that facilitates this aim of mobile reception is the use of multi protocol encapsulated—forward error correction (MPE-FEC) of received data. MPE-FEC facilitates recovery of data by a receiver in situations of high data-packet loss, which can occur when a receiver is in a changing environment, for example when a receiver is moving. MPE-FEC regroups data into blocks (MPE-FEC frames) and performs forward error correction on these data blocks. For an efficient error correction mechanism, a common approach is to have MPE-FEC frames larger than 512 Kbits. Thus, a receiver operating within a DVB-H compatible system receives an MPE-FEC frame with up to 2 Mbit of data over a single channel in a relatively short time period, for example 200 millisecond.

It is also known that to save power, the DVB-H standard has incorporated a technique of 'time-slicing' 100, as illustrated in FIG. 1. Time slicing is a mechanism that regroups data into bursts 110. A burst is a quantity of data 125 that is sent in a small amount of time 115 termed a burst duration. The next burst is sent after a significant time delay, termed 'off-time' 120, and so on. During this period of time, bursts from other programs or applications may be sent. Thus, a burst 110 may utilise an increased burst bandwidth 130 for a burst duration 115, which is in excess of a constant bandwidth 135 available across all time periods. In this manner, the receiver is only activated when there is a burst. Generally, within the DVB-H standard, bursts and MPE-FEC frames correspond. This means that there are an integer number of complete MPE-FEC frames per burst.

Historically, DVB-T originally was meant for MPEG2 video transmitted in MPEG2 Transport Steam (TS). MPEG2 TS is protected with Reed Solomon (RS) Forward Error Correction (FEC) codes. Then application of Multi-protocol Encapsulation (MPE) decoding enables transport of Internet Protocol (IP) data packets. Thus, to cope with mobile propagation degradation, DVB-H introduced another layer of RS FEC called MPE-FEC. Here, only MPE blocks with correct cyclic redundancy check (CRC) are further processed by the MPE FEC decoder. If the CRC fails, the whole block is discarded. Zeros are then inserted at the proper byte positions in the RS code words, instead of the block data, and are marked as "unreliable". If there are more than 64-unreliable byte positions in a RS code word, the RS decoder cannot correct anything, and therefore just outputs the bytes without error correction.

Referring now to FIG. 2, a known MPE-FEC decoder 200, as proposed in the EN 301 192 V1.4.1 standard, is illustrated. The MPE-FEC decoder comprises a demodulator 205 for demodulating a received signal, followed by an inner decoder 210 and outer decoder 215 for decoding the demodulated received signal. The inner decoder is a convolutional decoder. The reception is typically implemented using a soft-decision Viterbi decoder. This reduces the effect of thermal noise and interference on the quality of the received signal, as Viterbi errors are generally bursty in nature. A Reed-Solomon decoder is used as the outer decoder, which feeds the decoded, demodulated received signal into an MPEG2 Transport Stream (TS) de-multiplexer to de-interleave received data packets. The MPE data packets are then divided into IP datagrams 225, 240 and RS column data 230, 245. A typical table of MPE-FEC data is illustrated in FIG. 3. These MPE data packets are then input into the MPE-FEC decoder 250 to provide output corrected IP datagrams 255.

Referring now to FIG. 3, a known MPE-FEC table 300 contains redundant information that can be used to remove errors not corrected by the inner and outer decoders of FIG. 2. The MPE-FEC table 300 comprises an Application data table 310 comprising IP datagrams 310, some padding 315 and Application padding columns 320. In addition, an RS data table 335 comprises RS data 325 and punctured RS data columns 330. The 64 punctured RS data columns carry redundancy information of the Application data table 310. These columns facilitate recovering of lost sections with the method described below.

The specification EN 301 192, clause 9.3.3 suggests a method for MPE-FEC decoding as follows: "The number of rows in the MPE-FEC Frame is signalled in the time_slice_fec_identifier_descriptor. The number of padding columns in the Application data table is signalled in the header of each MPE-FEC block. The number of punctured RS columns can be calculated as 63−last_block_number, since last_block_number indicates the block number of the last block. As the block numbering is zero based, the indicated number is, thus, one less than the number of columns.

The Receiver introduces the number of padding bytes in the Application data table, as indicated in the MPE-FEC blocks. It marks these padding bytes as 'reliable'. If the Receiver has received the last block of the Application data table correctly, i.e. the table_boundary_flag, it can mark any remaining padding bytes in the Application data table as reliable. If the Receiver did not receive the last block correctly it will have to assume that all byte positions after the last correctly received block until the first padding column is lost data, even if some of it effectively is padding, and mark the corresponding byte positions as unreliable. Since the number of padding columns is signalled the maximum number of padding bytes that could be marked as unreliable is equal to no_of_rows−1. The effect on coding performance because of such unreliable padding bytes is marginal.

All MPE and MPE-FEC blocks are protected by a CRC-32 code, which reliably detects all erroneous blocks. For every correctly received block belonging to the Application data table or to the RS data table, the Receiver looks in the block header for the start address of the data payload within the block and is then able to place the payload in the right position of the respective table.

After this procedure there are, in general, a number of remaining "holes", which corresponds to lost blocks. All correctly received bytes, and Application data padding, can then be marked as "reliable" and all byte positions in the "holes", and in the punctured RS columns, can be marked as "unreliable" in the RS decoding.

All byte positions within the MPE-FEC Frame (Application data table+RS data table) are now marked as either "reliable" or "unreliable". With such MPE-FEC reliability (erasure) information the RS decoder is able to correct twice the number of erroneous or unreliable bytes, which means the code can correct up to 64 such bytes per 255-byte codeword.

If there are more than 64 unreliable byte positions in a row the RS decoder will not be able to correct anything and will therefore typically just output the byte errors without error correction. The Receiver will therefore have perfect knowledge about the positions of any remaining byte errors within the MPE-FEC frame after RS decoding. If a datagram is only partly corrected the receiver will be able to detect this and (optionally) discard this datagram.

In addition to the CRC-32, which detects erroneous blocks, the RS decoder also very reliably detects erroneous TS packets. If an MPEG-2 demultiplexer discards erroneous packets it could be designed not to build blocks, which contain lost TS packets. In this way, almost only correct blocks would be built and the role of the CRC-32 would be to provide additional error detection functionality, which normally is not needed. In very rare cases it may happen that the RS decoder fails to detect an erroneous TS packet, . . . and that an erroneous block therefore could be constructed. In these cases the CRC-32 would discover such a block error."

Thus, according to EN 301 192 V1.4.1, 'Digital Video Broadcasting (DVB); DVB specification for data broadcasting': "if there are more than 64 unreliable byte positions in a row the RS decoder will not be able to correct anything". Any such limitation in performance means, amongst other drawbacks, a reduced cell coverage for a cellular data network, a lower maximum operating speed, etc Thus, a need exists for an improved data communication unit comprising a decoder, a method of decoding and data communication network.

SUMMARY OF THE INVENTION

In accordance with aspects of the invention, there is provided a data communication unit, a digital communication network and a method of decoding therefor as defined in the appended Claims.

BRIEF DESCRIPTION OF THE DRAWINGS

FIG. 1 illustrates a known MPE-FEC decoder as proposed by the EN 301 192 V1.4.1 standard.

FIG. 2 illustrates a known example of time-slicing, as applied in a known DVB-H receiver.

FIG. 3 illustrates a known MPE-FEC table, utilizing IP datagrams and RS data.

Exemplary embodiments of the present invention will now be described, by way of example only, with reference to the accompanying drawings, in which:

FIG. 4 illustrates a simplified block diagram of a digital video broadcasting system supporting DVB-H communication, adapted in accordance with embodiments of the invention.

Figure 5:
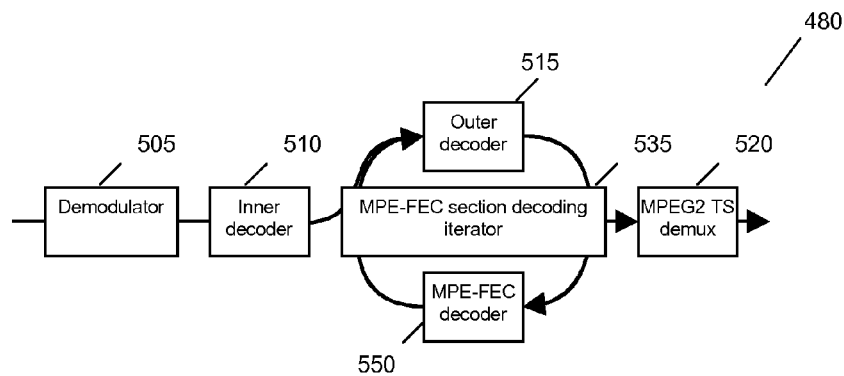

FIG. 5 is a flowchart illustrating a method for MPE-FEC decoding in accordance with embodiments of the invention.

Figure 6:
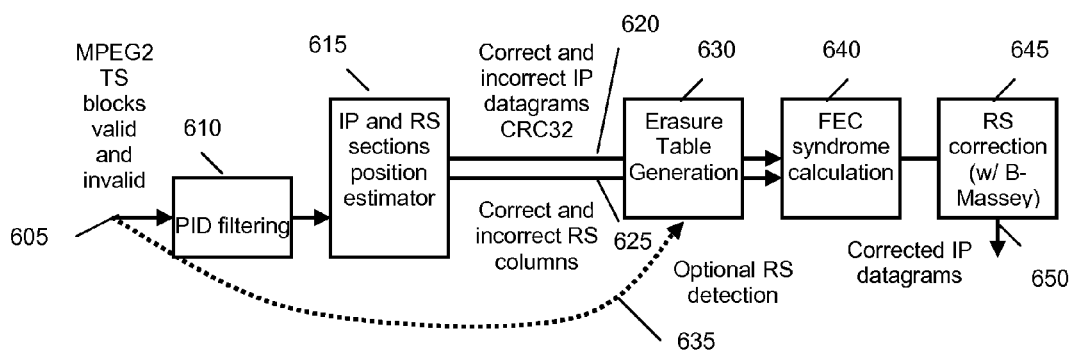

FIG. 6 is a flowchart illustrating a method for MPE-FEC decoding in accordance with embodiments of the invention.

Figure 7:
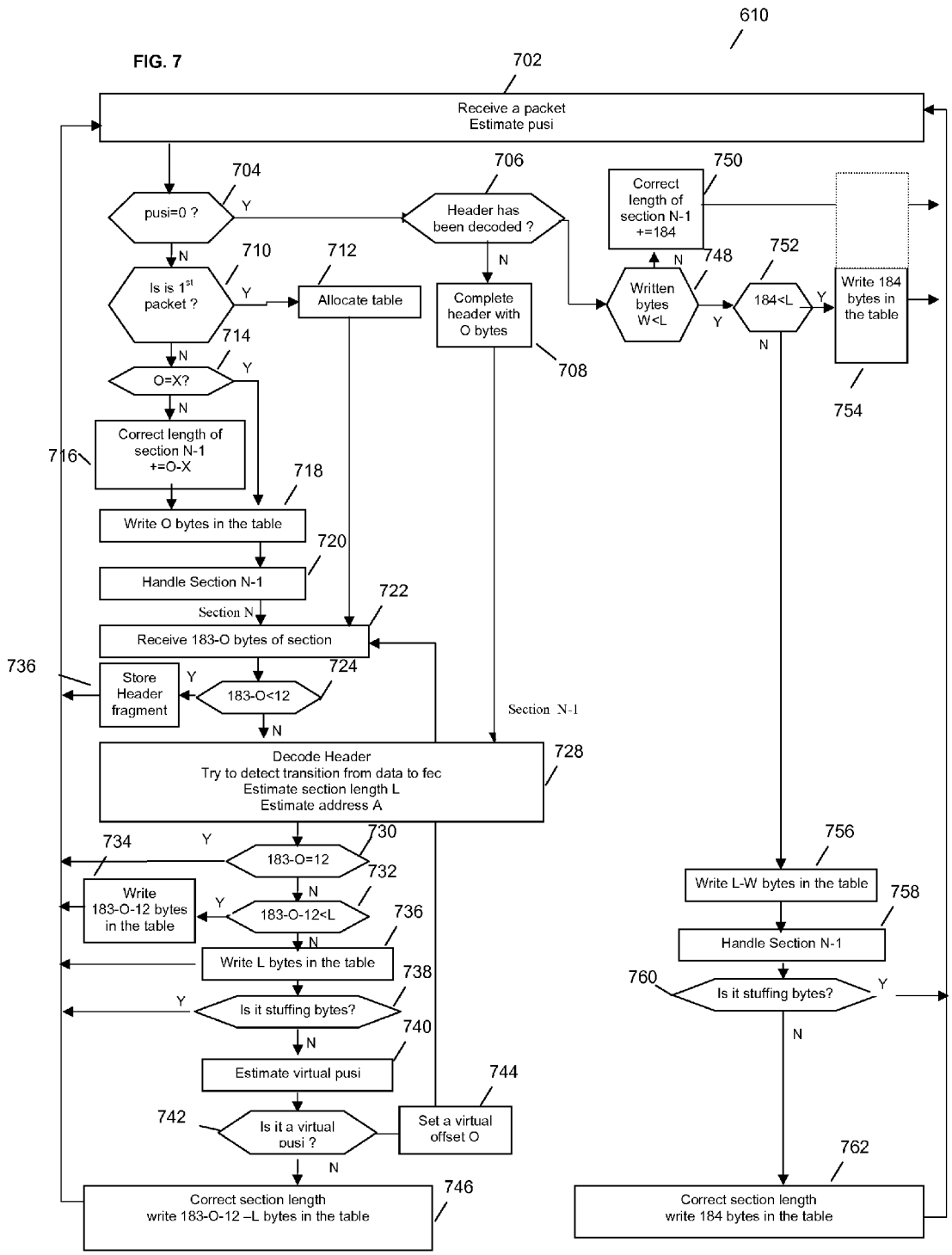

FIG. 7 is flowchart illustrating a method of IP and RS section position estimation in accordance with embodiments of the invention.

Figure 8:
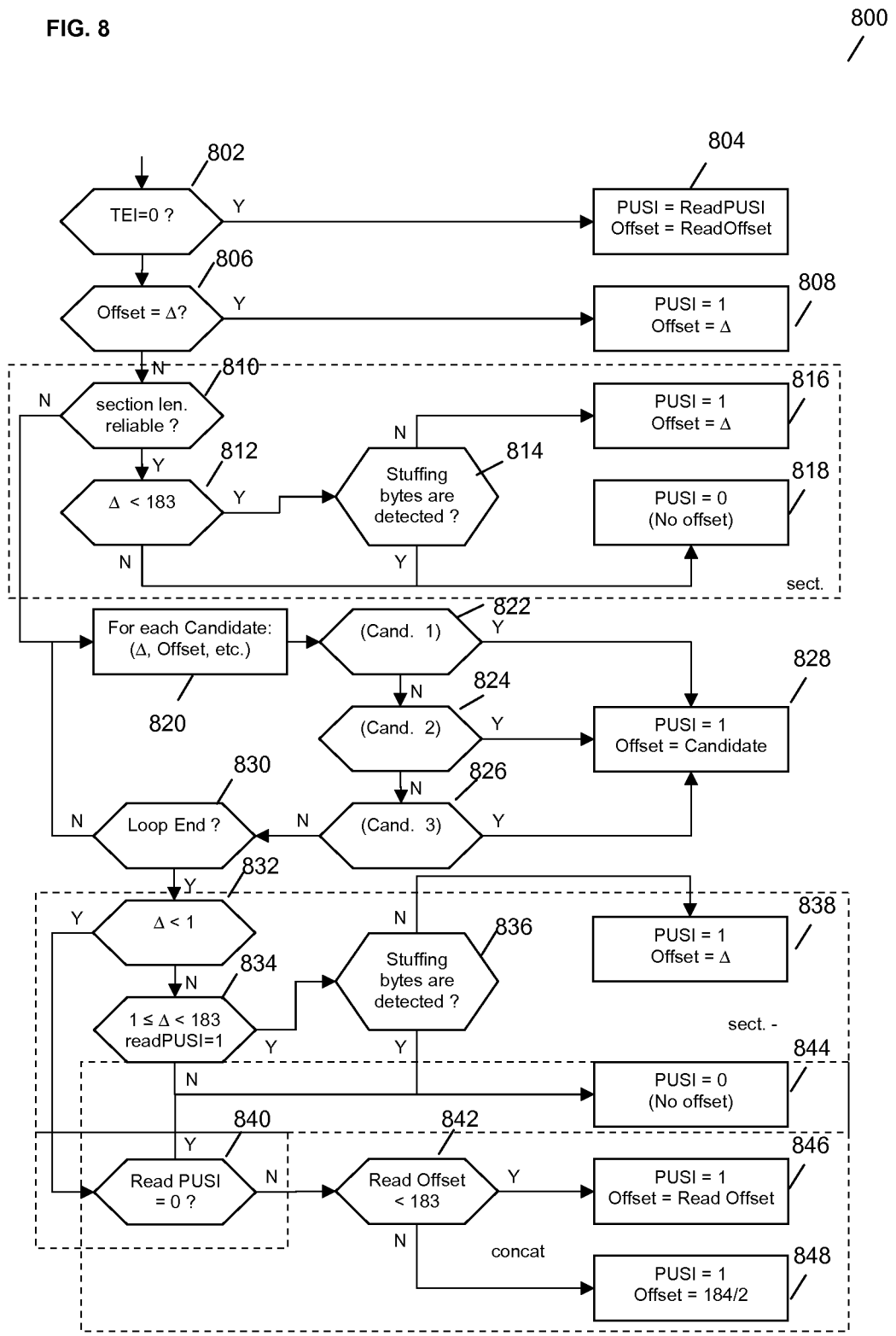

FIG. 8 is flowchart illustrating component 702 of FIG. 7 in accordance with embodiments of the invention.

Figure 9:
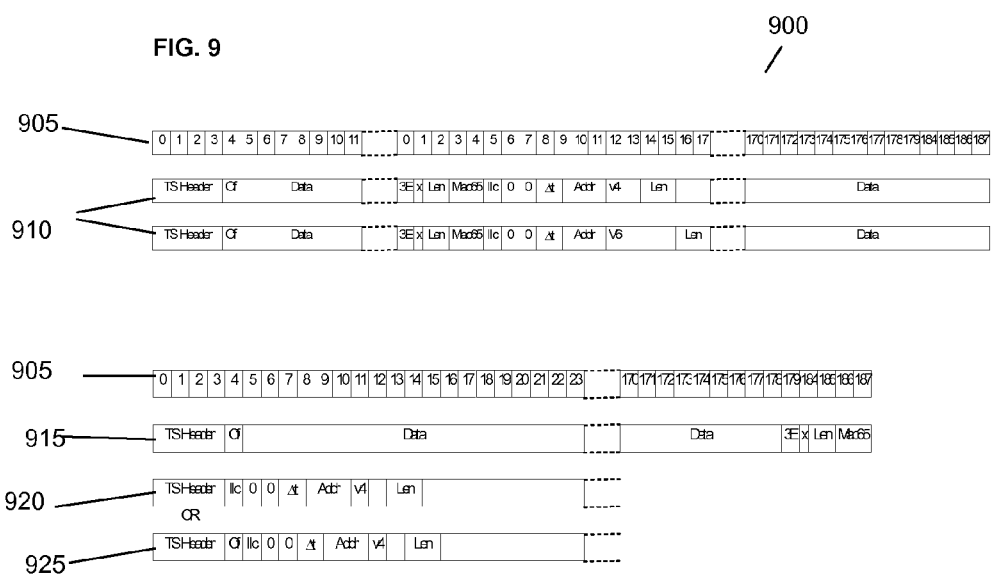

FIG. 9 illustrates a number of TS packets in accordance with embodiments of the invention.

DESCRIPTION OF EMBODIMENTS

Embodiments of the invention will be described in terms of a digital video broadcast handset (DVB-H), adapted to comply with standards ETSI EN 300 744 and ETSI EN 301 192. Advantageously, DVB-H embodiments of the invention allow broadcast IP-based content (MPEG-4 video streams, for example) to be transmitted to handheld devices over the existing MPEG-2 Transport Stream (TS) infrastructure of legacy DVB systems. The IP streams are fragmented into blocks and encapsulated using the Multi-Protocol Encapsulation (MPE) protocol. Cyclic redundancy checks (CRC) are specified to detect corrupted MPE blocks.

Although embodiments of the invention will be described in terms of a digital video broadcast handset, it will be appreciated that the inventive concept herein described may be embodied in any apparatus that incorporates transmissions that include concatenated codes, especially when the second code is a block code such as BCH (Bose, Ray-Chaudhuri, Hocquenghem) codes or Reed Solomon codes.

In summary, the inventive concept proposes to cope with transmission over noisy mobile radio channels, applying iterative decoding techniques for an outer RS code and a MPE-FEC RS code, where MPE-FEC blocks of data are not discarded when the CRC has failed to correct erroneous bytes of data.

Embodiments of the invention propose a novel scheme to significantly improve a performance of the MPE FEC compared to the known prior art. Variations of the proposed scheme, in order to balance performance improvements and increased computational complexity, are outlined.

Referring now to FIG. 4, a simplified block diagram of a digital video broadcasting (DVB) communication network 400 comprises a broadcast transmitter broadcasting textual and multimedia information to a remote receiver unit across a wireless channel 460. The broadcast transmitter is operably coupled to a server 420 and arranged to receive and process a broadcast signal that comprises both a textual portion and multimedia information. The server 420 separates the textual and multimedia information into multiple bursts of data sub-blocks, where substantially each sub block comprises the textual data and a sub-block of multimedia information for transmitting to the remote receiver unit.

In order to introduce new DVB-H services into an existing DVB-Terrestrial network using a multiplexing approach, a DVB-H IP Encapsulator 415 encapsulates IP datagrams 410 using MPE logic 420, MPE-FEC logic 425 and time-slice capable internet protocol (IP) encapsulators (IPE) 430. The DVB-H IP Encapsulator 415 is connected to a multiplexer 435. Time-slice capable internet encapsulation is the filtering of IP datagrams of interest. These IP datagrams are encapsulated in the Transport stream (MPEG2-TS).

A set of MPEG2 data channels 405 (comprising, say, a DVB-T service) is also multiplexed by multiplexer 435 onto the Transport Stream (TS) link 445. The multiplexer 435 is ideally located in each coverage area and contains a fixed amount of bit-rate that is reserved for DVB-H services. The multiplexer 435 provides a fixed bit-rate for DVB-H channels. Notably, the number of multiplexers determines the granularity of service coverage areas. This is a primary reason why these multiplexers 435 are ideally located locally in each coverage area (either a multiple frequency network (MFN) or a single frequency network (SFN)).

These encapsulated IP datagrams are fed via a DVB-T modulator 450 comprising processing logic 455 to encode the MPEG data onto a number of wireless broadcast DVB-T terrestrial transmitters and then transmit only during the time interval corresponding to the service allocated for the time slice.

On the receiver side, the encapsulated IP datagrams are received at a receiving communication unit and input into a DVB-T demodulator 465 comprising processing logic 470 to decode the MPEG data into a Transport stream (MPEG2-TS) 475. The MPEG data is input into a DVB-H IP Decapsulator 480 that decapsulates IP datagrams using time-slice capable internet protocol (IP) decapsulators (IPE) 485, MPE-FEC RS decoding 490 and MPE logic 495 to produce decoded IP datagrams 498.

In accordance with embodiments of the invention, the DVB-H IP Decapsulator 480 is adapted such that it does not discard MPE blocks following an incorrect cyclic redundancy check (CRC). Instead of discarding MPE blocks following an incorrect cyclic redundancy check, the DVB-H IP Decapsulator 480 places the potentially erroneous bytes into RS code words instead of zeros.

Furthermore, in embodiments of the invention, the DVB-H IP Decapsulator 480 identifies (flags) the byte positions of corrupted MPE blocks as being unreliable.

For these erroneous bytes that are placed into RS code words, the MPE-FEC RS decoder 490 of the DVB-H IP Decapsulator 480 performs RS-decoding on the RS code words. In one embodiment of the invention, the RS decoding is performed using a Berlekamp-Massey search algorithm, even for RS code words having more than 64 unreliable bytes. In this context, the RS code RS(255, t=32) has the following properties.

1. It is possible to locate and correct up to 32 errors (using for instance a Berlekemp-Massey search).
2. Thus, it is possible to detect up to 64 errors.
3. Hence, It is possible to locate up to 64 errors (using external information, (such as erasures) then it is possible to correct these 64 errors.

The EN 301 192 V1.4.1 standard only uses this third property. The EN 301 192 V1.4.1 standard states that if less than 65 errors are located, then it is not possible to correct anything. As explained in the embodiments herein described, this statement is shown to be false. In particular, it is shown that it is still possible to use property '1' above and correct up to 32 errors. Indeed, there are frequent situations were you have less than 32 errors per row but erasure information do not give any information on errors location. In these cases it is possible to correct these 32 errors.

Furthermore, the MPE-FEC RS decoder 490 of the DVB-H IP Decapsulator 480 may be configured to check that the Berklekamp-Massey algorithm does not locate errors outside of the MPE-FEC erasure information.

In addition, in embodiments of the invention, the DVB-H IP Decapsulator 480 is arranged to apply the aforementioned principles to iterative decoding techniques for the outer RS code and the MPE FEC RS code, to further improve the performance. In this manner, the DVB-H IP Decapsulator 480 may be arranged to jointly decode MPEG2 TS RS and MPE-FEC RS code words through the use of iterative decoding.

Referring now to FIG. 5, the DVB-H IP Decapsulator 480, and particularly the iterative aspect of some embodiments of the invention, is illustrated in greater detail. The DVB-H IP Decapsulator 480 comprises a demodulator 505 arranged to demodulate the received MPEG2 packet data stream. The demodulator 505 is operably coupled to an inner decoder 510 for decoding the demodulated MPEG2 packet data stream. The inner decoder 510 is operably coupled to an outer iterative decoder, in embodiments of the invention. The outer iterative decoder comprises an MPE-FEC block decoding iterator 535, for receiving the decoded, demodulated MPEG2 data stream. The MPE-FEC block decoding iterator 535 routes the decoded, demodulated MPEG2 data stream in an iterative decoding manner using both a MPE-FEC RS decoder 550 and an outer decoder 515. Following the iterative decoding operation, the decoded, demodulated MPEG2 data stream is output from the MPE-FEC block decoding iterator 535 to a MPEG2 Transport Stream de-multiplexer logic 520.

During the first iteration, MPE and MPE-FEC sections are de-fragmented from MPEG2 TS packets and feed the MPE-FEC table. The MPE-FEC decoder does correct the IP datagrams and RS columns encapsulated in MPE and MPE-FEC sections. In addition to this process, the MPE-FEC does store relations between input MPEG2 TS and de-fragmented MPE sections and datagrams. Therefore, if an IP datagrams is corrected, the iterator 535 is able to reconstruct original MPEG2 packets that are now partially corrected. Advantageously, in accordance with embodiments of the invention, some MPEG2 TS IP datagrams that were previously impossible to correct, may now be correctable.

It is envisaged that in some embodiments of the invention, iterations mat be run multiple times.

In an enhanced embodiment of the invention, if a MPEG2 packet was correctly decoded during a previous iteration, then it is not necessary to re-run the decoding. A further enhanced and more efficient embodiment of the invention is to re-decode only the MPEG2 TS values that have changed. With this further enhanced embodiment, it is even possible to cope with MPEG2 TS false correction. A yet further enhanced and more efficient embodiment relates to RS syndrome computation, in that, instead of re-computing syndromes during the next iterations, it is faster to update the syndromes themselves.

It is envisaged that in one embodiment of the invention, when time-slicing is used, a MPE-FEC block decoding iterator may be used to temporarily replace the MPEG2TS de-multiplexer 520. For a DVB-T signal, an MPEG2 TS de-multiplexer is used to separate the different programs. In DVB-H, MPEG2 packets are input to the MPE-FEC block iterator, which is required to estimate a relationship between input packets and IP datagrams/RS columns.

FIG. 6 illustrates a yet more detailed diagram 600 of the MPE-FEC decoding operation. The MPE-FEC decoding operation comprises receiving an input signal of MPEG2 TS blocks, having both CRC corrected data blocks and non-CRC corrected data blocks 605. The MPEG2 TS blocks 605 are input to a PID de-multiplexer 610, which enables the MPE-FEC decoder to detect corrupted packets that may contain useful information. The PID de-multiplexer 610 outputs filtered MPEG2 data to a position estimator of Internet Protocol (IP) and Reed Solomon (RS) blocks, which places both correct (trivial) datagrams 620 and incorrect blocks of MPEG datagrams 625 in the MPE-FEC table.

Notably, the ETSI EN 300 744 standard suggests usage of CRC32 as a means to generate MPE-FEC erasure information. However, in accordance with embodiments of the invention, the MPE-FEC erasure table information 630 is generated from both CRC corrected datagrams 620 and non-CRC corrected blocks of MPEG datagrams 625 using the input MPEG2 TS blocks 605. Following the generation of the MPE-FEC erasure table information 630, the MPEG data is passed to FEC syndrome calculation logic 640 and thereafter to RS correction, say using a Berlekamp-Massey algorithm 645 to produce corrected IP datagrams 650.

RS algebraic decoding typically involves the steps of syndromes computation, error location and then error correction. Syndromes are similar to CRCs. When all the syndromes are null, then the received data does not contain errors. If syndromes are not null, then an error may be located either directly from additional information (such as erasure location) or computed directly from syndromes. In the context of the invention, the Berlekamp-Massey algorithm 645 algorithm that enables to locate errors from syndromes as explained in Massey, J. L. "Shift-Register Synthesis and BCH Decoding:" IEEE Trans. Information Th. 15, 122-127, 1969. If the error can be located, then a linear system is solved to deduce the value of errors Nevertheless, the first iteration may be based on CRC32, which is more robust. Subsequent iterations may be based on MPEG2 TS information. It is envisaged that any combination of iterations may be used, It is noteworthy that when potential error locations (erasures) are provided, this information must be accurate. If some bytes are identified as not containing errors, then these byte must not contain errors. If the bytes do contain errors, then the decoder will fail to correctly decode the bytes. Alternatively, the same approach applies for identifying bytes that may contain errors. If the bytes do not contain errors, then the decoder will again fail to correctly decode the bytes. For example, values will be decided as being correct, when in reality they are not they are not, etc.

Bytes are indicated as correct when the CRC32 is correct. It is more reliable than a value given by MPEG2TS packets. Indeed MPEG2 TS packet may be correct but their position in the MPE-FEC table may be incorrect. If the MPEG2 TS packet information is directly relied upon, then values in the MPE-FEC could be falsely marked as correct. If the first iteration based on CRC32 does not work, then the algorithm should attempt to use MPEG2 TS CRC information.

In Multi-Protocol encapsulation, MPE sections of data are fragmented into MPEG2 TS packets. A Payload Unit Start Indicator ("PUSI") bit in the MPEG2 TS packet header is used to indicate a start of a new section. When the 'pusi' bit is set to '1', a first byte of the data payload, termed 'offset', points to a first byte of the new (current) section. In the context of the present invention, when a MPEG2 TS packet is not correctly decoded by the outer decoder, its Transport Error Indicator (TEI) is set to '1' by the outer decoder. Thus, when a Transport Error Indicator (TEI) in a received packet is set to '1', the packet is identified as being damaged during the reception. Therefore, the 'pusi' bit may be corrupted; the offset may be corrupted too. In accordance with embodiments of the invention, alternative algorithms to detect the section start, when a TEI bit is set to '1', are described below.

Referring now to FIG. 7, a flowchart illustrates positioning of the fragments of sections into the MPE-FEC table in accordance with embodiments of the invention. The process commences in step 702 with receiving a data packet. A determination of whether the payload unit start indicator ('pusi' bit) equals zero is then made ('pusi' bit='0'?), as shown in step 704. If the 'pusi' bit='0', as shown in step 704, a determination of whether the header of the received packet has been decoded is made, as shown in step 706. If the header of the received packet has not been decoded in step 706, a determination of whether the packet contains a complete header with zero bytes can be made, as shown in step 708.

If the 'pusi' bit does not equal zero, in step 704, a determination is made as to whether the received packet is the first packet, as shown in step 710. If the received packet is the first packet, in step 710, the first packet is allocated a position in a table, as shown in step 712 and the process moves to step 722. If the received packet is not the first packet, one ore more fragment(s) of the current section are positioned in the table, in step 710. Using the information on the length of the section, we know 'X', the number of remaining bytes, to write in the table to complete the section. Further, according to the pusi 'bit' estimation function, a new section begins in the MPEG-2 TS packet. It is also possible to estimate the offset 'O' to the beginning of the new section. Consequently, 'O' is also the number of bytes in the MPEG2-TS payload before the beginning of the new section, a determination of O=X? is made. If 'O' does not equal 'X', (that is the number of bytes to the beginning of the next section is not equal to the remaining bytes to write for the current section, thereby the previously estimated section length was false and needs to be corrected), as shown in step 714, the correct length of section N−1 is set to ='O−X', as shown in step 716. Thereafter, or If 'O' does equal 'X', in step 714, 'O' bytes of section N−1 are written in the table as shown in step 718. Then section 'N−1' is processed, in step 720 and '183−O' bytes of section N are written in the table.

It is noteworthy that the MPEG2-TS packet length is 188 bytes, with 4 bytes header, and 184 bytes payload. In case a PUSI is present, the $5^{th}$ byte is the offset value. Next 'O' bytes are used for the end of the section 'N−1' and the remaining '183−O' bytes for the section 'N−1'. Each section begins with a header of twelve bytes and a payload of variable length, and, thus, only the section payload will be written in the MPE-FEC frame.

The process then moves to step 720, where Section N−1 of the received packet is processed. 183 O bytes of section N−1 are received, as shown in step 722. A determination is then made as to whether the section header of length 12 bytes has not been completely received in this section fragment, namely whether '183−O'<12, as shown in step 724. If '183−O'<12, in 724, the header fragment is stored, as shown in step 726. If '183−O'=>12, a complete section header has been received in step 724, the header is decoded and the process tries to detect a transition from data to the FEC, as shown in step 728.

Furthermore, in one embodiment of the invention, the process estimates a section length 'L' and estimates a position of address 'A'. Advantageously, the section length 'L' and address 'A' are provided in the section header. An estimation is required as some bytes values may be corrupted. The address provides the byte position in the MPE-FEC frame for the first byte of the section and 'L', the section payload length, specifies the number bytes of the section payload to write in the MPE-FEC frame.

A determination is then made as to whether (183−O=12 bytes), in step 730. If 183−O=12 bytes, there is no more data to handle then the process loops back to step 702. This also applies when a fragment of the section payload has also been received in this packet, If 183−O does not equal 12 bytes, in step 730, a determination is made as to whether 183−O−12<L bytes, in step 732. If it is determined that 183−O−12<L, in step 732, 183−O−12 bytes are written into the table, as shown in step 734, and the process loops back to step 702. If it is determined that 183−O−12 is not less than L, in step 732, 'L' bytes are written into the table, as shown in step 736. Thus, section length 'L' value is used to ensure that no more bytes than available in the section length are written in the MPE-FEC frame.

A determination is then made as to whether bytes are stuffed into the received packet, as shown in step 738. In a case where there are stuffing bytes in the MPEG2-TS packet, there is no more data to process and the next MPE2-TS packet can then be processed. If bytes are stuffed into the received packet, in step 738, the process loops back to step 702. If bytes are not stuffed into the received packet, in step 738, we need to determine if the section 'N' has been completed and a new section 'N+1' begins here, or if the estimated section length 'L' was false and needs to be corrected. To determine if a new section begins, an estimate of a virtual 'pusi' is made, as shown in step 740.

In one embodiment of the invention, it is envisaged that there may be multiple sections inside the same TS packet, for example, when sections are less than 180 bytes or so long, there can be multiple sections starts inside the same MPEG2 TS packet. Thus, PUSI and offsets, in this embodiment may be sent only for the first section start. For subsequent sections, and to maintain homogeneity within the code, it is possible to define a "virtual PUSI'. In this regard, the process considers that the PUSI was transmitted and an estimate of the 'pusi' value can be made. Indeed, as described previously, for most criteria, the actual received value of PUSI is not read, it is estimated.

A determination is then made as to whether the Section N−1 is a virtual 'pusi', as shown in step 742. If the Section N−1 is a virtual 'pusi', in step 742, a virtual offset O is set, as shown in step 744, and the process loops back to step 728. If the Section N−1 is not a virtual 'pusi', in step 742, a correction of the section length is performed and 183−O−12−L bytes are written into the table, as shown in step 746, before the process loops back to step 702.

Referring back to step 706, where a determination of whether the header of the received packet has been decoded is made. If the header of the received packet has been decoded in step 706, a determination is made as to whether the written bytes (W) W<L as shown in step 748. If the written bytes W is not less than L, in step 748, a length of section N−1 is corrected to +=184, as shown in step 750, with the process then looping back to step 702, where N+=184 is an obfuscated 'C' language notation that means N=N+184 i.e. N is incremented by 184. If the written bytes W is less than L, in step 748, then a determination is made as to whether 184<L, as shown in step 752. If 184<L, in step 752, then 184 bytes are written into the table as shown in step 754, before the process loops back to step 702.

If 184 is not less than in step 752, L-W bytes are written into the table as shown in step 756. Section N−1 of the received packet is then processed, as shown in step 758 and a determination is made as to whether the received packet contains stuffed bytes is made, as shown in step 760. If it is determined that the received packet contains stuffed bytes, in step 760, the process loops back to step 702. If it is determined that the received packet does not contain stuffed bytes, in step 760, the section length is corrected and 184 bytes are written into the table as shown in step 762.

A summary of the terms and values used in FIG. 7 is shown in Table 1 below:

TABLE 1

| | | | |
|---|---|---|---|
| (Rel.) | Is Offset reliable? If Offset is equal to delta, offset is reliable | PUSI = 1 | Offset |
| (Sect) | The previous[1] section length was reliable, delta > 182, a section continues (PUSI = 0), otherwise if stuffing bytes are detected, a section ends (PUSI = 0), otherwise a new section starts (PUSI = 1). For each of the "Candidate Offset", either Offset or Delta. | PUSI = 0 or 1 | Delta or n/a |
| (Cand. 1) | "Candidate Offset" points to the expected table id | PUSI = 1 | Candidate Offset |
| (Cand. 2) | "Candidate Offset" points to a MPE header which includes a MPE-FEC address is equal to what the section length suggests | PUSI = 1 | Candidate Offset |
| (Cand. 3) | "Candidate Offset" point to a MPE header which contains a reliable section length (MPE length = IP length) | PUSI=1 | Candidate Offset |
| (Sect-) | This is the same rule as (Sect) above but we do not require the section length to be reliable. Nevertheless, it is applied only when the Read PUSI is equal to 1. Delta must be positive. | PUSI = 0, 1 | Delta |
| (Concat) | If Delta is negative, the read PUSI is what we only have left. If the read PUSI is equal to 1, read offset is chosen when it is valid, when it is not 184/2 may be used instead. | Read PUSI | Offset = 0 Or Offset or 184/2 |

It is noteworthy that the terms Sect- and Concat are partially merged in FIG. 7: If ReadPUSI=0 then PUSI=0 and PUSI=1 otherwise. This is equivalent to a decision PUSI=ReadPUSI.

In a case where a PUSI has been detected in the received packet, a new section has been completely received inside this packet and there are some remaining bytes in the packet, we may consider a possibility that a second new section may commence in the same packet. To determine if a second new section begins at an end of the packet, the problem is similar to the initial section. In this regard, in accordance with one embodiment of the invention, an estimate for a PUSI for the second section is made. This second PUSI is termed 'virtual', as it is known that it was not transmitted. It is not possible to read the Virtual PUSI but it is possible to deduce its value.

Along with the concept of Virtual PUSI, in accordance with one embodiment of the invention, a Virtual Offset is introduced, which is the offset inside the remainder of the TS packet that points to the next section start.

The remainder of the TS packet is a "Virtual TS" packet with a given VirtualTSLen. With this approach many criteria do not apply, and the following criteria remain:

TABLE 2

| TEI = 0 | Virtual PUSI is not sent. | n/a | n/a |
|---|---|---|---|
| (Rel.) | Offset for next sections is not sent | n/a | n/a |
| (Sect) | The previous section length was reliable, delta > 182, a section continues (PUSI = 0), otherwise if stuffing bytes are detected, a section ends (PUSI = 0), otherwise a new section starts (PUSI = 1). The "Candidate Offset", is Delta. | PUSI = 0 or 1 | Delta or n/a |
| (Cand. 1) | "Candidate Offset" points to the expected table id | PUSI = 1 | Candidate Offset |
| (Cand. 2) | "Candidate Offset" points to a MPE header which includes a MPE-FEC address is equal to what the section length suggests | PUSI = 1 | Candidate Offset |
| (Cand. 3) | "Candidate Offset" point to a MPE header which contains a reliable section length (MPE length = IP length) | PUSI = 1 | Candidate Offset |
| (Sect-) | Read PUSI is not available, PUSI = 0 is preferred | n/a | n/a |
| (Concat) | Virtual PUSI and Virtual Offsest are not received | PUSI = 0 | Offset = 0 |

Following this approach, the same code is used independent of a TEI value. Furthermore, a section length estimation 615 may be performed for the data section, as illustrated in Table 3 below.

TABLE 3

| TEI = 0 | Section length might be readable |
|---|---|
| Others | Comparing MPE and IP data may give a reliable value (This value has to be less than 4096 bytes) |

A length of the section is indicated in an MPE section header. This length of section value may be corrupted too and needs to be estimated, as described below with respect to FIG. 8.

Most of the time, there is only one section start in the MPEG2 TS packet. With very short sections, there can be multiple sections starts. MPE-FEC frames contain successive MPE sections then MPE-FEC sections. In embodiments of the invention, the transition between these two sections is estimated. In embodiments of the invention, an end of MPE-FEC is estimated too, as described later. In embodiments of the invention where an end of MPE-FEC is estimated, some sections may have been lost, or the address read in the section header may be corrupted. Hence, in this regard, it is needed to estimate the position of the section before writing it in the table.

Finally, once the respective sections have been identified MPE and MPE-FEC section are placed into a MPE-FEC table. The position in this table, which is normally indicated in a header of the individual sections, is estimated, as also described later.

Referring back to FIG. 6, the internet protocol (IP) and reed solomon (RS) section start detection and section position estimation logic 615 is described in greater detail as illustrated in FIG. 8. In embodiments of the invention, the process relies on the 'pusi' bit to detect a section start; then the offset value is assessed to find a section start position. When the TS packet is unreliable, the 'pusi' bit is not reliable. As often in estimation processes, it is necessary to then invert the normal operation. If an accurate position estimation is very probable, then a logical consequence is that a section does actually start (the 'pusi' bit is decoded as '1').

Referring now to FIG. 8, a flowchart 800 illustrates a section start detection and section position estimation process (as described in logic 615 in FIG. 6) in accordance with embodiments of the invention. The process commences with determining whether a Transport Error Indicator bit (TEI)=0, as shown in step 802. If the TEI=0, in step 802, the 'pusi' bit is read and the offset bit is read, as shown in step 804. If the TEI does not equal '0', in step 802, a determination is made as to whether the Offset='Δ', as shown in step 806.

Delta variable ('Δ') indicates a difference between an estimated section length and a number of bytes written in the table. In one case, where the estimated section length was correct and there is no lost of section fragments, then the last fragment is received and this value Delta is equal to Offset as it is the number of remaining bytes to complete the section.

If the Offset=Δ, in step 806, the 'pusi' bit is set to '1', as shown in step 808 (compare to step 704 in FIG. 7). If the Offset does not equal Δ, in step 806, a determination is made as to whether the section length is reliable, as shown in step 810.

It is envisaged that, in other embodiments of the invention, different methods may be used to determine if a section length is reliable. For example, the section length may be read in a fragment of the section header. In this regard, one would need to receive the three first bytes of the section header. If the packet with this segment is received with no error (i.e. the Transport Error Indicator is zero), the read section length is understood as being reliable.

In a yet further exemplary embodiment of the invention, let us consider a case where the payload is an IP datagram and the complete IP datagram header has not been received, for example the 40 bytes of header for IPv6 protocol. In this context, it may be considered as reliable if the read section length in the section header is equal to the IP datagram read size plus the header section size.

If the section length is determined as being reliable, in step 810, a determination is made as to whether Δ<183, as shown in step 812. If Δ<183, in step 812, a determination is made as to whether the received packet contains stuffed bytes, as shown in step 814. If the received packet does not contain stuffed bytes, in step 814, the 'pusi' bit is set to '1' and the Offset is set to =Δ, as shown in step 816. If the received packet does contain stuffed bytes, in step 814, or 'Δ' is not less than '183', in step 812, the 'pusi' bit is set to zero (No offset), as shown in step 818.

If the section length is determined as not being reliable in step 810, for each candidate (with respect to values for Δ, Offset, etc.), the following loop is performed as shown in step 820: A determination is made as to whether the first section is 'Candidate '1'; as shown in step 822. If it is not, a determination is made as to whether the first section is 'Candidate '2', as shown in step 824. If it is not, a determination is made as to whether the first section is 'Candidate '3', as shown in step 826, and so on. If any of the Candidates are the first section in any of respective steps 822, 824, 826, the 'pusi' bit is set to equal '1' and the Offset is set to equal that particular candidate, as shown in step 828.

Assuming a new section starts in the MPEG2 TS, the PUSI bit is equal to '1' and the offset points to the start of the section. Thus, the various candidate values can be tested for an offset ("Candidate Offset"). If the value pointed to by this candidate offset is compatible with a section start (for example, one of the three Candidate criteria is met), then this candidate offset is deemed to be correct.

If none of the candidates identified as the first section, then a determination is made as to whether the loop is finished, as shown in step 830. If the loop has not finished in step 830, the process loops back to step 820. If the loop has finished in step 830, a determination is made as to whether Δ<1, as shown in step 832. Normally Δ is the length of what remains of the current section. When the read section length value was not correct, it is possible that this length becomes negative. Thus, it may be considered as equivalent to the section length being unknown, If 'Δ' is not less than '1', in step 832, a determination is made as to whether 1≤Δ<183 readPUSI=1, as shown in step 834. If 1≤Δ<183 readPUSI=1, in step 834, a determination is made as to whether the received packet contains stuffed bytes, as shown in step 836. If the received packet does not contain stuffed bytes, in step 836, the 'pusi' bit is set to '1' and the Offset is set to =Δ, as shown in step 838. If the received packet does contain stuffed bytes, in step 814, or 1≤Δ<183 read-PUSI=1 is not valid, in step 834, the 'pusi' bit is set to zero (No offset), as shown in step 844.

If 'Δ' is less than '1', in step 832, the 'pusi' bit is read in step 840 and identified as to whether it equals zero. If the 'pusi' bit equals zero in step 840, the 'pusi' bit has no offset, as shown in step 844. If the 'pusi' bit does not equal zero in step 840, the Offset value is read in step 842 and determined as to whether it is less than '183', as shown in step 842. If the Offset value is less than '183', in step 842, then the 'pusi' bit is set to '1' and the Offset is set to a Read Offset value, as shown in step 846. If the Offset value is not less than '183', in step 842, then the 'pusi' bit is set to '1' and the Offset is set to a value of '184/2', as shown in step 848. In a MPEG2 TS packet, when a section ends, it is likely that a new section will start just after this section. The criteria described here are based on this assumption. However, it is also envisaged that the inventive concept is also applicable to a scenario where no new section starts and alternatively stuffed bytes may be transmitted.

Thus, FIG. 8 discloses a method to estimate whether a section position can be determined. The process then compares the offset value and an expected offset value. After that, multiple candidate offsets can be generated. For each candidate offset, in one embodiment of the invention, three criteria are used to decide whether the pointed to section is possible (namely Cand. 1, Cand. 2 and Cand 3). Finally, when all these criteria fail, PUSI is used.

Referring now to FIG. 9, an illustration of TS packets 900 is shown. Normally, depending on whether IPv4 or IPv6 is used, packet types 910 are used, for the timing frame 905. However, when a header of the IPv4 or IPv6 frame is divided between two TS packets, a variety of frame formats 915, 920, 925 can be obtained.

In FIG. 9, depending on whether or not a length of a next section is greater than '183+2', an offset may be inserted. Sometimes, an estimation of the PUSI of the next TS packet is needed in order to determine whether a section length is reliable. However, the (Sect) rule requires a reliable section length to apply.

To a lesser extent, it may not be possible to read the MPE length value. The MPE length value provides a candidate offset. It is envisaged that potential problem of reading the MPE length value may be solved by employing one of the following two approaches:

(i) An iterative approach: where a first estimate of the PUSI bit is calculated, without a Delta candidate. For instance, the PUSI of the next packet may be estimated as the ReadPUSI. A section length may then be re-computed accordingly and the PUSI bit may also be re-computed. If the initial PUSI bit detection fails, this improvement will not work. Indeed, the read IP length value will not be correct and will not likely enable a reliable section length detection. Thus, section starts will not be detected.

(ii) When a section length 'L' is not available, it is proposed that two possible values are tested for the Section length. In this embodiment, two possible candidate values may be used for the MPE section length and two candidate values for the IP length (depending on whether the next PUSI is equal to 0 or 1). Therefore, up to four candidate values for Delta may be utilised instead of two.

In an enhanced embodiment of the invention, an estimate of the Section length is performed only once and preferably before the next PUSI bit detection. It is noteworthy that in case the IP address location is in the next TS packet, it is not possible to determine the exact location prior to the PUSI bit detection for this packet.

In an alternative embodiment of the invention, it is envisaged that it may be possible to perform multiple estimation length, but at an additional cost. In this embodiment a decision is made on the PUSI bit for the new packet to be able to estimate an actual section length and then to make a second estimation for the PUSI bit using this estimation. In this regard, a first estimation is performed with the information contained in the same packet as the beginning of the header. A second estimation is then made with the information contained in the same packet as the end of the header. A third estimation is then made when, say, the first forty bytes of the section have been received.

Referring now to the generation of the MPE-FEC (erasure) table 630 the position of the data may be clarified. In one embodiment of the invention, there are two candidates for the actual section length's estimation, a read address in a received section header ("read address") and an address provided by a previous estimated position and a determination of a last section length ("wanted address" or concatenation position). It is noteworthy that the detection of a section length may be the last estimated section length or a number of written bytes between the section beginning and detection of a beginning of a next section.

In a further embodiment of the invention, it is considered that a yet further possible candidate for the position may be calculated using a read section number in a section header.

In an enhancement to the above estimations, in one embodiment of the invention, a position estimation error may be identified. For instance:

(i) A first section may be received, read and, say, written to address '1000'. However, the address deduced from concatenation may be '960'. The concatenation position may be obtained using the previous estimated section length or the last written byte of the last received section, for example, where the last byte of the last section is just before the first byte of the new section. Therefore, address '960' would be written into the table.

(ii) A second section may then be received, read and, say, written to address '1200'. However, the address deduced from concatenation may be '1160'. Therefore, address '1160' would be written into the table. However, it may be identified that a constant error of 40 bytes may be constantly being made, probably because a section was lost and that the read value 1200 was actually correct.

This error may be calculated until a correct read section address is used, for example if the complete section header is received without error.

In a yet further embodiment of the invention, positions of sections may be advantageously determined and used. In accordance with this embodiment of the invention, each time a good section is placed in the table, with a correct position, it means that the address has been read in the header section. Depending upon the outcome of the decision algorithm described in Table 4, the chosen position to write a section in the table may be the address read in the section header or the concatenation address deduced from previous section position and length. As the cyclic redundancy checking (CRC) of the section is correct, then it may be assumed that the read address is also correct, should an additional verification on the PID may be required. A correct section received with a correct CRC and an error on the PID may belong to another application table from another service and should not be written in the table.

It is also useful to check that the Table ID read in the section corresponds to the wanted Table_ID in order to verify the transition between the Application data table and RS data table has not be missed. This determination may be made by the decision algorithm described in Table 5). The section will then be written in a good portion of the table. Thus, the last correct position in the table (for example the "last good offset") is stored and consequently the next position is known to be after the last good (known and stored) position. The verification that the address has been read in the section header, when the section length is correct, is important otherwise the reliability calculation will be false and the RS decoding will fail.

In a yet further embodiment of the invention, the section number may be advantageously used. In this embodiment of the invention, a determination of a transition from Application Data to Reed-Solomon (RS)-Data has an impact on the position detection accuracy. Indeed the address read in the section header is relative to a beginning of the application data or of the RS-data. If, when the first section carrying the RS-Data is received and a transition of the data to FEC data is missed, it is useful to use the section number if it appears correct for example should a maximum of 3 sections have been missed.

Table 4 below provides a list of criteria for the address section, in accordance with one embodiment of the invention.

TABLE 4

| Criterion | Description | Chosen position in the MPE-FEC table |
|---|---|---|
| TEI = 0 | Position might be readable. | Select the "read address" |
| Verify validity 1 | If "wanted address" is not in the table | Uses the Section number to select another "wanted address" |
| Verify validity 2 | If "wanted address" is still not in the table we have to verify validity of "read address" | If "read address" is in the table Select the "read address" else set address to a dummy value |
| Verify validity 3 | If "read address" is not in the table | Select the "wanted address" |
| Compare two successive read address | In case the difference between two successive read address is equal to the previous estimated section length | Select the "read address" |
| Compare previous wanted address and actual read address | In case the difference between the last wanted address and the actual read address is equal to the previous estimated section length | Select the "read address" |
| Verify table offset | We verify the wanted address is after the correct written sections. | Select the "wanted address" |
| default | | Select the "read address" |

In accordance with one embodiment of the invention, and referring now to the detection of MPE-FEC table end position, two transitions may be estimated:

(i) Transition from data to FEC sections; and
(ii) An end of the MPE-FEC table.

With respect to a transition of data from the FEC, as illustrated in Table 5 below, during MPE reception the expected Table ID is located at: '0x3E'. In addition, during the reception of MPE-FEC, the Table ID is located at: '0x78'. MPE-FEC reception always starts with an expected table ID equal to '0x3E'. In accordance with one embodiment of the invention, one method is to decide when a candidate offset points to an address: '0x78'. Once it is determined that the candidate offset points to an address: '0x78', then it may be assumed that a FEC section has been located and, thus, a transition is detected.

A problem with this approach occurs when an offset is corrupted. In such a case, the offset will point to a random value and this random erroneous value may be '0x78'. In this case, the false transition would imply that the next sections will be detected as FEC and the whole reception will thus, be jeopardized. A second problem with this approach is that during the transition, if the header is corrupted, a FEC section may appear as a MPE section.

Therefore, in accordance with an enhanced embodiment of the invention, a second criterion, in addition to the Table ID, may be used; namely, the address in the MPE-FEC table. The address and the size of the first FEC column are totally predictable. If a section points to such an address in a particular table, then the transition may be identified. Considering the read Table_ID in packets with TEI=0, the detected table id will be reliable. However, some section may be missed. Hence, in some embodiments of the invention, it is envisaged that it may enhance a performance of the decoder to detect the table transition using corrupted packets.

In this case, false transition detection may occur. Thus, mechanisms are required to detect false detection and to go back in the feeding of the application data part if the wanted table id is determined as not being reliable. For example, in some embodiments of the invention, the false transition detection may be performed during a reception of the first RS-data section.

TABLE 5

| Criterion | Description | Decision |
|---|---|---|
| TEI = 0 for the TS packet containing table_id | If table_id = 0x3e verify that no false detection has occurred checking the last table_id! + 0x78 | Select Read_table_id Table_id is reliable. |
| TEI = 1, Last wanted tableid = 0x3e Last wanted tableid different from read tableid = 0x78 | May verify the Section number/ last section number to have indication on the reliability. | Detect transition Table_id is not yet reliable. |
| Last wanted tableid same ad read tableid = 0x3e | Use the Section, last section Number and address field value to detect a possible transition. | If address = 0, Section = 0 and Last section <65 Detect transition Table_id is not reliable. |
| TEI = 1, Last wanted tableid = 0x78 table_id is not reliable. | | |
| read tableid = 0x3e | Decrease the reliability, transition may be false | May detect a false transition detection |
| read tableid = 0x78 | Increase the reliability on the detection transition | |

TABLE 6

| Feed the table | Last Section N − 1 | New section N | 2$^{nd}$ New section N + 1 | Modify values |
|---|---|---|---|---|
| Pusi is detected, X remaing bytes to write | | | | |
| Offset = remaining bytes to write | Write offset bytes in table | | | No change |
| Offset < remaining bytes to write | | | | Change last section length (section N − 1) Section Length+ = (offset − X) |
| Offset > remaining bytes to write | | | | |
| | | L = (184 − offset) < New section length Write L bytes in table | | No change |
| | | L = (184 − offset) > New section length | | |
| | | Write section length bytes for section N | Detect stuffing bytes Do nothing | No change |
| | | Write section length bytes for section N | Detect another section beginning Write beginning of new section N + 1 | No change |
| | | Write section length bytes for section N | No detection of a section beginning False section length, write end of section N | Change section length for section N Section Length+ = (184 − offset) |
| No Pusi detected, X bytes to write to complete section | | | | |
| Written bytes < section length X < 184 | Write X bytes, to end the section | Detect stuffing bytes: do nothing Increment the written bytes count by 184 − X. (Eventually feed the table with the remaing 184 − X bytes.) | | Change section length for section N − 1 Section Length+ = (184 − X) |

TABLE 6-continued

| Feed the table | Last Section N − 1 | New section N | 2$^{nd}$ New section N + 1 | Modify values |
|---|---|---|---|---|
| Written bytes >= section length | Increment the written bytes count by 184. (Eventually write the 184 bytes in the table) | | | Change section length for section N − 1 Section Length+ = 184 |

Normally a single bit is used to indicate the end of MPE-FEC table. In a corrupted environment, this indication is insufficient. Hence, in accordance with one embodiment of the invention, this single bit shall be relied on only if the data is known to be correct. If the data is not known to be correct, a second indication may be used. Hence, in place of segmentation information, two bytes may be used to indicate a number of FEC columns and a current FEC column number. When, say, 63 columns out of a total of 63 columns are received, then the decoder then knows that the FEC table has been totally received.

In summary, the previous estimation of: pusi detection, offset, address and section length estimation may be used to feed the MPE-FEC application table as illustrated in Table 6. The rules may be used to feed the table for each new TS packet received.

Although embodiments of the invention are described with reference to a DVB-H unit using MPE-FEC and time slicing technologies, it is envisaged that the inventive concept is equally applicable to other data communication systems and technologies where two consecutive RS codes are used, as the second concatenated code uses RS codes using erasures and errors.

It is within the contemplation of the present invention that the inventive concept is able to complement the DVB-H standard. It is also envisaged that the inventive concept can be used within future broadcasting standards, including web-site broadcasting.

It will be understood that the wireless communication unit, data communication network and method of decoding data therein, as described above, aim to provide at least one or more of the following advantages:

(i) In not discarding MPE blocks having incorrect CRC and placing the potentially erroneous bytes into an RS code words (instead of zeros), applying iterative RS decoding on the outer code and MPE-FEC RS codes, a reduction in the signal-to-noise ratio (SNR) of 2-dB can be achieved, in achieving an IP packet error rate of 1%, as compared to prior art, under typical radio channel conditions.

(ii) In not discarding MPE blocks having incorrect CRC and placing the potentially erroneous bytes into an RS code words (instead of zeros), and applying RS decoding can achieve a reduction in the signal-to-noise ratio (SNR) of 1-dB, at marginally increased computational complexity compared to prior art.

(iii) The invention can be generalized in a straight forward manner to apply to all future systems using 2 consecutive RS codes. In particular, the inventive concept can be applied to present-day DVB-H systems.

In particular, it is envisaged that the aforementioned inventive concept can be applied by a semiconductor manufacturer to any integrated circuit architecture supporting an improved data communication network or for use in a decoder in a data communication unit. It is further envisaged that, for example, a semiconductor manufacturer may employ the inventive concept in a design of a stand-alone device, or application-specific integrated circuit (ASIC) and/or any other sub-system element employing an integrated circuit to support an improved data communication network or for use in a decoder in a data communication unit.

It will be appreciated that any suitable distribution of functionality between different functional units or controllers or memory elements, may be used without detracting from the inventive concept herein described. Hence, references to specific functional devices or elements are only to be seen as references to suitable means for providing the described functionality, rather than indicative of a strict logical or physical structure or organization.

Aspects of the invention may be implemented in any suitable form including hardware, software, firmware or any combination of these. The elements and components of an embodiment of the invention may be physically, functionally and logically implemented in any suitable way. Indeed, the functionality may be implemented in a single unit or IC, in a plurality of units or ICs or as part of other functional units.

Although the present invention has been described in connection with some embodiments, it is not intended to be limited to the specific form set forth herein. Rather, the scope of the present invention is limited only by the accompanying claims. Additionally, although a feature may appear to be described in connection with particular embodiments, one skilled in the art would recognize that various features of the described embodiments may be combined in accordance with the invention. In the claims, the term 'comprising' does not exclude the presence of other elements or steps.

Furthermore, although individual features may be included in different claims, these may possibly be advantageously combined, and the inclusion in different claims does not imply that a combination of features is not feasible and/or advantageous. Also, the inclusion of a feature in one category of claims does not imply a limitation to this category, but rather indicates that the feature is equally applicable to other claim categories, as appropriate.

Furthermore, the order of features in the claims does not imply any specific order in which the features must be performed and in particular the order of individual steps in a method claim does not imply that the steps must be performed in this order. Rather, the steps may be performed in any suitable order. In addition, singular references do not exclude a plurality. Thus, references to "a", "an", "first", "second" etc. do not preclude a plurality.

Thus, an improved data communication unit comprising a decoder, data communication network and method of decoding have been described, where the aforementioned disadvantages with prior art arrangements have been substantially alleviated.

The invention claimed is:

1. A wireless communication unit comprising:
a receiver for receiving information from a remote transmitter unit, the receiver including a demodulator and a decoder, the demodulator for demodulating received data packets coupled to the decoder arranged to perform a cyclic redundancy check (CRC) on the demodulated received data packets and perform multi-protocol encapsulated (MPE) decoding thereon;
wherein the decoder is arranged to perform iterative decoding on both data packets whose CRC indicates that the data packets are non corrupted and data packets whose CRC indicates that the data packets are corrupted and arranged to place MPE non-corrected CRC data packets into Reed Solomon (RS) code words;
wherein the decoder comprises predictive logic for predicting section starts and section lengths of received data packets, detecting section length errors on the data packets whose CRC indicates that the data packets are corrupted, recognizing the detected errors as section length errors, and correcting, without use of CRC correction, the section length errors on the data packets whose CRC indicates that the packets are corrupted.

2. The wireless communication unit of claim 1 wherein the decoder is arranged to perform RS-decoding using a Berlekamp-Massey search algorithm.

3. The wireless communication unit of claim 2 wherein the decoder is arranged to perform RS-decoding using a Berlekamp-Massey search algorithm for RS code words with more than 64 unreliable bytes.

4. The wireless communication unit of claim 2 wherein the decoder is arranged to check that the Berlekamp-Massey search algorithm does not locate errors outside of MPE-forward error corrected (FEC) erasure information.

5. The wireless communication unit of claim 1 wherein the decoder is arranged to perform iterative decoding for both an outer RS code and an MPE forward error corrected (FEC) RS code.

6. The wireless communication unit of claim 1 wherein the decoder comprises a block position estimator arranged to recover possibly corrupted section position information and place corrupted packets constituting corrupted sections in a MPE-FEC table.

7. The wireless communication unit of claim 1 wherein the decoder is arranged to jointly decode MPEG2 TS RS and MPE-FEC RS through the use of iterative decoding.

8. The wireless communication unit of claim 1 wherein the decoder is adapted to decode signals compliant with ETSI EN 300 744 or ETSI EN 301 182 standards.

9. The wireless communication unit of claim 1 wherein the decoder is adapted to decode signals compliant with broadcast IP-based content, wherein the broadcast IP-based content comprises MPEG-4 video data streams.

10. The wireless communication unit of claim 1, wherein the decoder is to correct the section length errors before MPE-RS erasure table generation.

11. The wireless communication unit of claim 10, wherein the decoder is to provide output to a de-multiplexer logic.

12. An integrated circuit comprises:
a decoder; and
a demodulator for demodulating received data packets coupled to the decoder;
wherein the decoder is arranged to perform a cyclic redundancy check (CRC) on the demodulated received data packets and perform multi-protocol encapsulated (MPE) decoding thereon, wherein the decoder is arranged to perform iterative decoding on both data packets whose CRC indicates that the data packets are not corrupted and data packets whose CRC indicates that the data packets are corrupted and arranged to place the MPE non-corrected CRC data packets into Reed Solomon (RS) code words, wherein the decoder includes predictive logic for predicting a section start and a section length of a first section of received data packets and for predicting a section start and a section length of a second section of the received data packets, wherein a Payload Unit Start Indicator bit is sent for only the first section of the received data packets and not sent for the second section.

13. A method of decoding data information in a wireless communication unit comprising:
receiving information from a remote transmitter unit;
demodulating received data packets;
performing a cyclic redundancy check (CRC) on the demodulated received data packets;
performing multi-protocol encapsulated (MPE) iterative decoding on both data packets whose CRC indicates that the data packets are corrupted and data packets whose CRC indicates that the packets are non corrupted; and
placing the MPE non-corrected CRC data packets into Reed Solomon (RS) code words, wherein the decoder comprises predictive logic for predicting section starts and section lengths of received data packets, detecting section length errors on the data packets whose CRC indicates that the data packets are corrupted, recognizing the detected errors as section length errors, and correcting, without use of CRC correction and prior to RS correction of the data packets, the section length errors on the data packets whose CRC indicates that the packets are corrupted.

14. The integrated circuit of claim 12, wherein the predictive logic is to predict a section start and a section length of a second section of a received data packet of the received data packets by:
determining that a remaining length of the received data packet from a start of a first section of the received data packet to an end of the received data packet is greater than a remaining length of the first section from the start of the first section to an end of the first section; and
determining that bytes are not stuffed into the received data packet after the end of the first section.

15. The integrated circuit of claim 14, wherein:
the received data packet contains a header of h bytes;
a length of the received data packet is $\Omega$;
the header contains an offset O specifying a number of bytes from a start of the received data packet to the start of the first section; and
the determining that the remaining length of the received data packet from the start of the first section to the end of the received data packet is greater than the remaining length, L, of the first section from the start of the first section to the end of the first section comprises determining that:

$$\Omega - O - h > L.$$

16. The integrated circuit of claim 14, wherein the predicting the section length of a second section comprises:
selecting a candidate pointer to a section of the received data packet following the second section when an indicator identifies the received data packet as being damaged, during reception;
testing whether the candidate pointer points to an expected table id;

testing whether the candidate pointer points to an MPE header with an MPE-forward error corrected (FEC) address consistent with the predicted section length of the second section; and testing whether the candidate pointer points to an MPE header with a reliable section length.

17. The method of claim 13, wherein the correcting comprises:

receiving in headers of the received data packets offsets indicating numbers of bytes to starts of new sections in the received data packets;

comparing the offsets to the remaining bytes to write in current sections of the received data packets; and correcting the section lengths of the current sections when the offsets are not equal to the remaining bytes.

18. The method of claim 13, wherein the correcting comprises:

generating a candidate length of a section of a received data packet; and testing the candidate length.

19. The method of claim 18, wherein the generating comprises generating a candidate length based upon a read address in a received section header (read address) or generating a candidate length based upon an address provided by a previous estimated position and a determination of a last section length (wanted address).

20. The method of claim 19, wherein the testing a read address comprises testing by one or more of the following methods:

testing whether the read address is in an MPE-forward error corrected (FEC) table;

testing whether the difference between the read address and a read address of a subsequent section of the received data packet is equal to a previously estimated section length; and testing whether the difference between a last wanted address and the read address is equal to a previously estimated section length.

* * * * *